United States Patent
Chen et al.

(10) Patent No.: US 9,536,771 B2
(45) Date of Patent: Jan. 3, 2017

(54) GAP FILL SELF PLANARIZATION ON POST EPI

(71) Applicant: Taiwan Semiconductor Manufacturing Co. Ltd., Hsin-Chu (TW)

(72) Inventors: Po-Chang Chen, Jhubei (TW); Po-Hsiung Leu, Lujhu Township (TW); Ding-I Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 12 days.

(21) Appl. No.: 13/860,765

(22) Filed: Apr. 11, 2013

(65) Prior Publication Data

US 2014/0306294 A1    Oct. 16, 2014

(51) Int. Cl.
*H01L 29/66* (2006.01)
*H01L 27/02* (2006.01)
(Continued)

(52) U.S. Cl.
CPC ......... *H01L 21/762* (2013.01); *H01L 21/0214* (2013.01); *H01L 21/0234* (2013.01);
(Continued)

(58) Field of Classification Search
CPC ............. H01L 29/66795; H01L 29/785; H01L 29/4238; H01L 27/0207; H01L 29/0696; H01L 29/66772; H01L 29/42392; H01L 21/84; H01L 29/66659; H01L 29/7835; H01L 21/26586; H01L 29/1045; H01L 29/0847
(Continued)

(56) References Cited

U.S. PATENT DOCUMENTS 6,500,770 B1 * 12/2002 Cheng et al. ................. 438/782
7,622,369 B1    11/2009 Lee et al.
(Continued)

FOREIGN PATENT DOCUMENTS

KR    20040013776 A1    2/2004
KR    20120047032 A     5/2012
(Continued)

OTHER PUBLICATIONS

Notice of Allowance dated May 1, 2015 for co-pending Korean Application No. 10-2013-0148928.

*Primary Examiner* — John C Ingham
*Assistant Examiner* — Didarul Mazumder
(74) *Attorney, Agent, or Firm* — Eschweiler & Associates, LLC (57) ABSTRACT

The present disclosure relates to an integrated chip IC having transistors with structures separated by a flowable dielectric material, and a related method of formation. In some embodiments, an integrated chip has a semiconductor substrate and an embedded silicon germanium (SiGe) region extending as a positive relief from a location within the semiconductor substrate to a position above the semiconductor substrate. A first gate structure is located at a position that is separated from the embedded SiGe region by a first gap. A flowable dielectric material is disposed between the gate structure and the embedded SiGe region and a pre-metal dielectric (PMD) layer disposed above the flowable dielectric material. The flowable dielectric material provides for good gap fill capabilities that mitigate void formation during gap fill between the adjacent gate structures.

20 Claims, 6 Drawing Sheets

(51) Int. Cl.
*H01L 21/762* (2006.01)
*H01L 21/02* (2006.01)
*H01L 29/78* (2006.01)
*H01L 29/165* (2006.01)

(52) U.S. Cl.
CPC .. *H01L 21/02219* (2013.01); *H01L 21/02282* (2013.01); *H01L 21/02326* (2013.01); *H01L 29/66636* (2013.01); *H01L 29/165* (2013.01); *H01L 29/7848* (2013.01)

(58) Field of Classification Search
USPC .................................. 257/401; 438/284, 286
See application file for complete search history.

(56) References Cited

U.S. PATENT DOCUMENTS

| | | | |
|---|---|---|---|
| 2008/0029834 A1* | 2/2008 | Sell | H01L 29/4983 257/411 |
| 2009/0233411 A1 | 9/2009 | Ando | |
| 2011/0079856 A1 | 4/2011 | Tsai et al. | |
| 2011/0147810 A1* | 6/2011 | Hsu | H01L 21/30608 257/288 |
| 2011/0254105 A1* | 10/2011 | Cheng | H01L 29/7848 257/408 |
| 2011/0287600 A1* | 11/2011 | Cheng et al. | 438/299 |
| 2012/0094437 A1* | 4/2012 | Han et al. | 438/109 |
| 2012/0104470 A1* | 5/2012 | Ponoth | H01L 29/66545 257/288 |
| 2012/0104514 A1 | 5/2012 | Park et al. | |
| 2012/0126331 A1* | 5/2012 | Lin | H01L 21/82341 257/369 |
| 2012/0161204 A1* | 6/2012 | Flachowsky | H01L 29/165 257/192 |
| 2012/0180954 A1* | 7/2012 | Yang et al. | 156/345.34 |
| 2012/0299121 A1* | 11/2012 | Wu | H01L 21/2257 257/408 |
| 2012/0319203 A1* | 12/2012 | Cheng | H01L 29/66666 257/346 |
| 2013/0015533 A1 | 1/2013 | Wang | |
| 2013/0017662 A1 | 1/2013 | Park et al. | |
| 2013/0056827 A1* | 3/2013 | Tsai et al. | 257/347 |
| 2013/0082309 A1* | 4/2013 | Su | H01L 29/66636 257/288 |
| 2013/0084682 A1* | 4/2013 | Lee | H01L 21/82341 438/198 |
| 2013/0175640 A1* | 7/2013 | Illgen | H01L 29/78 257/402 |
| 2013/0313647 A1* | 11/2013 | Aquilino et al. | 257/368 |
| 2014/0051264 A1* | 2/2014 | Mallick et al. | 438/786 |
| 2014/0134824 A1* | 5/2014 | Chen et al. | 438/424 |
| 2014/0162431 A1* | 6/2014 | Lin et al. | 438/435 |

FOREIGN PATENT DOCUMENTS

| | | |
|---|---|---|
| KR | 20130009509 A | 1/2013 |
| TW | 201128700 A | 8/2011 |

* cited by examiner

GAP FILL SELF PLANARIZATION ON POST EPI

BACKGROUND

Integrated chips are formed by operating upon a semiconductor substrate with a plurality of integrated chip (IC) fabrication processes. In general, the IC fabrication processes used to form an integrated chip are separated into front-end-of-the-line (FEOL) processes and back-end-of-the-line (BEOL) processes. During FEOL processes, one or more transistor devices may be formed onto a semiconductor substrate. During BEOL processes, one or more metallization layers are formed within a dielectric material. The one or more metallization layers connect the one or more transistor devices to external (i.e., off-chip) components.

Typically, between the completion of FEOL processes and the commencement of BEOL processes, a dielectric layer is deposited between adjacent transistor devices (e.g., between adjacent gate structures). This dielectric layer, vertically positioned between the transistor devices and the metallization layers, is known as a pre-metal dielectric (PMD) layer.

DETAILED DESCRIPTION

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

Figure 1:
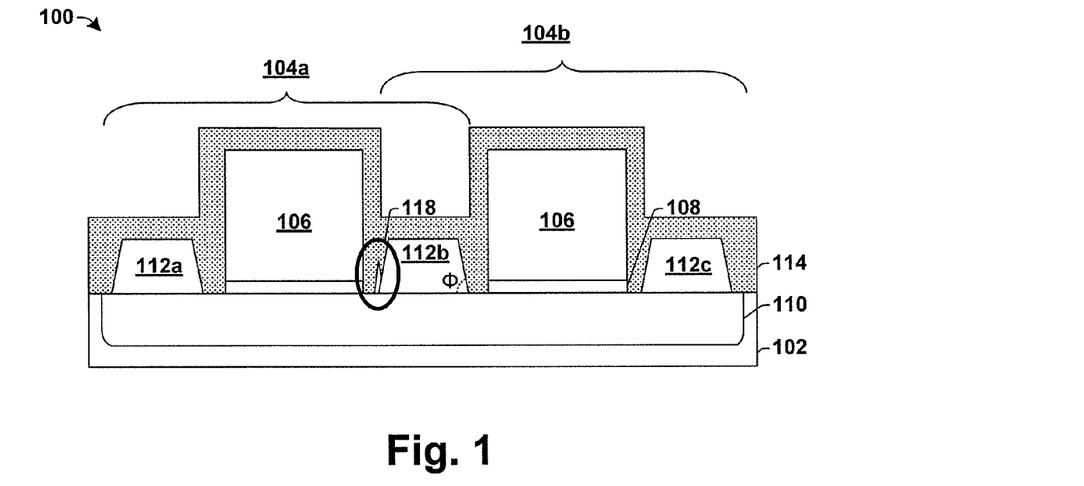
FIG. 1 illustrates a cross-sectional view of an integrated chip having transistor gate structures separated by a pre-dielectric material (PMD) oxide formed by a high aspect ratio process.

FIG. 1 illustrates a cross-sectional view of an integrated chip 100 comprising a first transistor device 104a and a second transistor device 104b located on a semiconductor substrate 102. The first transistor device, 104a, comprises a gate structure located between a first source region 112a and a drain region 112b. The second transistor device, 104b, comprises a gate structure located between the drain region 112b and a second source 112c. Respective gate structures comprise a gate oxide layer 108 disposed above an active area 110 of the semiconductor substrate 102. A gate region 106 is located above the gate oxide layer 108. The gate region 106 is configured to control the flow of charge between the source and drain regions (e.g., between 112a and 112b).

Gate structures of the first and second transistor devices, 104a and 104b, are separated by a gap filled with a pre-metal dielectric (PMD) layer 114 formed by a high aspect ratio process (i.e., a HARP oxide). As the size of integrated chip devices has decreased, the device gap spacing has also decreased to improve the density and performance of integrated chips. The small gaps and high aspect ratio (e.g., above 1.0) make adequate gap fill particularly difficult, leading to the formation of voids 118 in pre-metal dielectric (PMD) layer 114 gap-fill processes. Such gap fill problems increase for source and drain regions 112 that extend outward from the semiconductor substrate 102 and/or for keyhole voids that form re-entrant gaps having sidewall angles $\phi$ less than 90°.

Accordingly, the present disclosure relates to an integrated chip (IC) having transistor structures separated by a flowable dielectric material, and a related method of formation. In some embodiments, the IC comprises a semiconductor substrate and an embedded silicon germanium (SiGe) region extending as a positive relief from a location within the semiconductor substrate to a position above the semiconductor substrate. A first gate structure is located at a position that is separated from the embedded SiGe region by a first gap. A flowable dielectric material is disposed between the gate structure and the embedded SiGe region and a pre-metal dielectric (PMD) layer disposed above the flowable dielectric material. The flowable dielectric material provides for good gap fill capabilities that mitigate void formation during gap fill between the adjacent gate structures.

Figure 2:
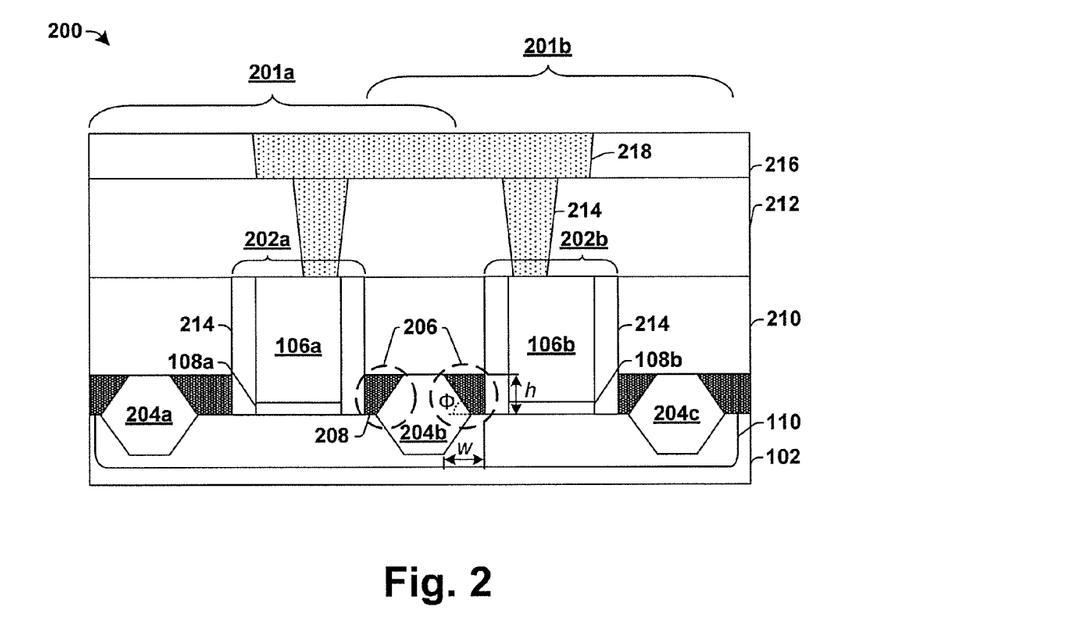
FIG. 2 illustrates a cross-sectional view of some embodiments of a disclosed integrated chip having transistor gate structures separated by a flowable dielectric material.

FIG. 2 illustrates a cross-sectional view of a disclosed integrated chip 200 having one or more transistor devices, 201a and 201b, with structures separated by a flowable dielectric material 208.

The integrated chip 200 comprises a semiconductor substrate 102. In various embodiments, the semiconductor substrate 102 may comprise a semiconductor material, such as silicon, germanium, etc. The semiconductor substrate 102 comprises an active area 110 (i.e., an oxide definition region) located within the semiconductor substrate 102 and having a higher dopant concentration than the surrounding semiconductor substrate 102.

Respective transistor devices, 201a and 201b, comprise a gate structure, 202a and 202b, respectively. The gate structures, 202a and 202b, have a gate region, 106a and 106b, disposed over a gate oxide layer, 108a and 108b. The gate regions, 106a and 106b, are configured to selectively control the flow of charge carriers from a source region to a drain region. In some embodiments, the gate regions, 106a and 106b, may comprise polysilicon. In some embodiments, the gate oxide layers, 108a and 108b, may comprise a thin layer (e.g., 5 nm to 100 nm) of silicon dioxide. In some embodiments, sidewall spacers 220 are located at positions adjacent to the gate regions, 106a and 106b. In various embodiments, the sidewall spacers 220 may comprise nitride sidewall spacers.

Respective transistors, 201a and 201b, further comprise a plurality of embedded epitaxial regions 204. The embedded epitaxial regions 204a-204c vertically extend as a positive relief from a location within the semiconductor substrate 102 to a position above the semiconductor substrate 102. The positive relief of the embedded epitaxial regions 204a-204c form gaps 206 between the embedded epitaxial regions 204 and the first and second gate structures, 202a and 202b. In some embodiments, the gaps may comprise re-entrant gaps having a width of an upper portion of the gap that is wider than a width of a lower portion of the gap. For example, in some embodiments, the embedded epitaxial region 204 may form sidewalls with the semiconductor substrate 102 having a sidewall angle φ of greater than 80°. In some embodiments, the gaps 206 may have an aspect ratio (i.e., a ratio of a height h of the gap to a width w of the gap) of greater than 12:1. In other embodiments, the gaps 206 may have an aspect ratio of greater than 14:1.

In some embodiments, the embedded epitaxial regions 204a-204c may comprise embedded silicon-germanium (SiGe) regions disposed within the semiconductor substrate 102. The embedded SiGe regions act as shared source/drain region of transistor devices, 201a and 201b. For example, a first SiGe region 204a acts as a source/drain of a first transistor device 201a, while a second SiGe region 204b acts as a drain/source of the first transistor device 201a. Similarly, the second SiGe region 204b acts as a drain/source a second transistor device 201b, while a third SiGe region 204c acts as a source/drain of the second transistor device 201b. In some embodiments, the embedded SiGe regions comprise strained epitaxial layers of SiGe disposed within the semiconductor substrate 102.

A flowable dielectric material 208 is located within the gaps 206 between the embedded epitaxial regions 204a-204c and the gate structures, 202a and 202b. In some embodiments, the flowable dielectric material 208 is in direct contact the semiconductor substrate 102 and with sidewalls of the embedded epitaxial regions 204.

In some embodiments, the flowable dielectric material 208 may comprise a flowable oxide. For example, in some embodiments, the flowable dielectric material 208 comprises a flowable chemical vapor deposition (CVD) oxide film (e.g., a carbon free flowable CVD silicon oxide). In other embodiments, the flowable dielectric material 208 may comprise a cured Trisilylamin (TSA) (i.e., $(SiH_3)_3N$) film applied by a spin coating process.

In some embodiments, the flowable dielectric material 208 has a height h that is substantially equal to a height of the positive relief of the embedded epitaxial region 204 beyond the semiconductor substrate 102. In such embodiments, the flowable dielectric material 208 material has a top surface that is even with a top surface of the SiGe region 204, resulting in a planar surface that comprises the flowable dielectric material 208 and the embedded epitaxial region 204.

A pre-metal dielectric (PMD) layer 210 is located above the flowable dielectric material 208. In some embodiments, the PMD layer 210 is located on the flowable dielectric material 208 and has a height that fills a remaining gap between the first and second gate structures, 202a and 202b. In various embodiments, the PMD layer 210 is may comprise a boron-phosphor-silicate glass deposited onto the flowable dielectric material 208 using a high aspect ratio process.

A plurality of back-end-of-the-line (BEOL) metal layers are located above the PMD layer 210. For example, in some embodiments, a first inter-level dielectric (ILD) layer 212 is disposed above the PMD layer 210. The first ILD layer 212 comprises one or more metal contacts 214 (e.g., tungsten contacts), which form a vertical extension between the gate regions 106 and a first metallization layer 218 (i.e., metal interconnect layer) located within a second inter-level dielectric layer 216.

Figure 3:
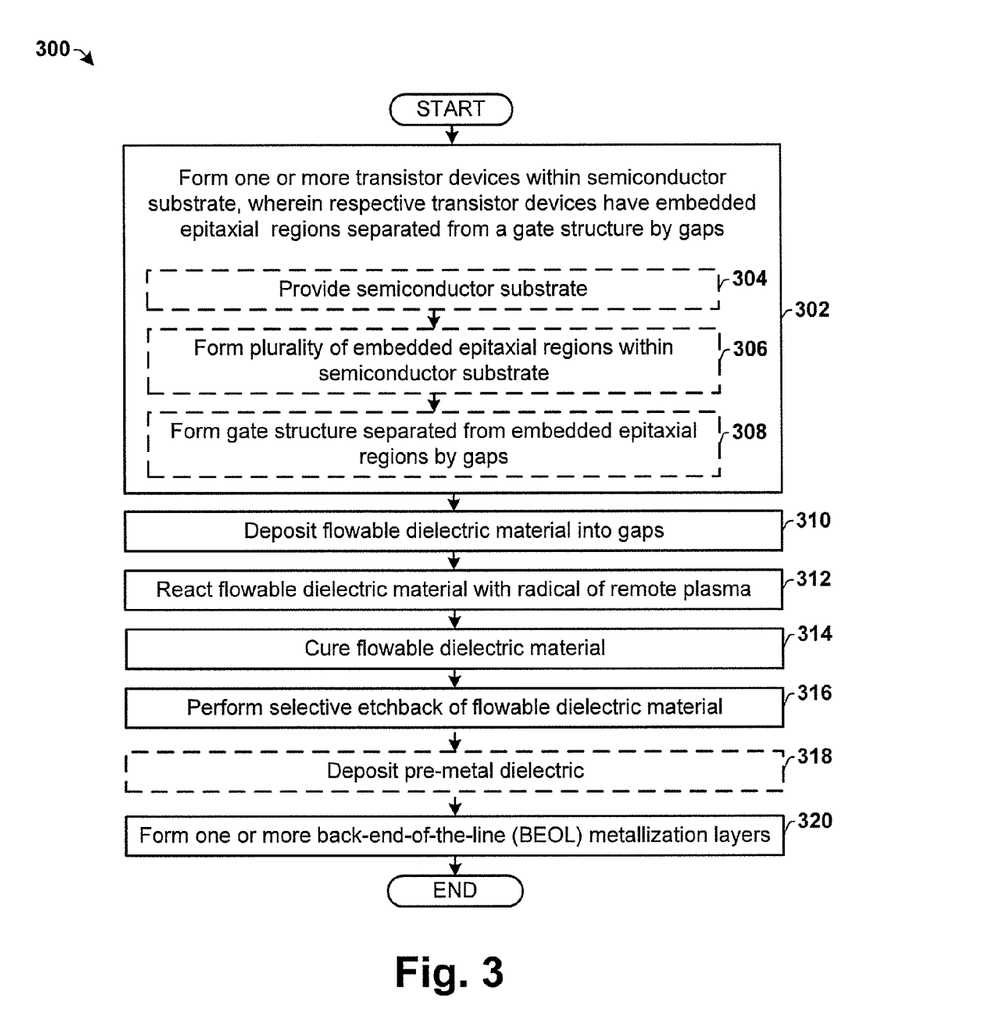
FIG. 3 is a flow diagram illustrating some embodiments of a disclosed method of forming an integrated chip having transistor gate structures separated by a flowable dielectric material.

FIG. 3 is a flow diagram illustrating some embodiments of a method 300 of forming an integrated chip having transistors separated by a flowable dielectric material.

It will be appreciated that while the disclosed method 300 is illustrated and described as a series of acts or events, that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

At act 302, one or more transistor devices are formed within a semiconductor substrate. Respective transistor devices have an embedded epitaxial region that extends as a positive relief from a location within the semiconductor substrate to a position above the semiconductor substrate. The embedded epitaxial regions act as source and/or drain regions. In some embodiments, the embedded epitaxial regions may comprise silicon germanium (SiGe) regions. Respective transistor devices further comprise a gate structure located on the semiconductor substrate and separated from the source and drain regions by way gaps. The gaps may have an aspect ratio (i.e., a ratio of a height to a width) of greater than 14:1. In some embodiments, the one or more transistor devices comprise a first transistor device having a first gate structure and a second transistor device having a second gate structure configured to share an embedded SiGe region that acts as a source and/or a drain. The embedded SiGe forms gaps between the embedded SiGe region and the first and second gate structures.

In some embodiments, the semiconductor substrate is formed by providing a semiconductor substrate, at 304. A plurality of embedded epitaxial regions are formed within the semiconductor substrate, at 306. A gate structure is then formed at a position that is separated from the embedded epitaxial regions by gaps, at 308.

At act 310, a flowable dielectric material is deposited onto the semiconductor substrate into gaps between the embedded epitaxial region the gate structure. The flowable dielectric material may be deposited as a low viscosity liquid that allows for the flowable dielectric material to easily change shape and fill the gaps. In some embodiments, the flowable dielectric material may comprise a Trisilylamin (TSA) (i.e., $(SiH_3)_3N$) film applied in liquid form by a spin coating process.

At act 312, the flowable dielectric material may be operated upon by a remote (i.e., indirect) plasma, causing the flowable dielectric material to interact with radicals of the remote plasma. The remote plasma provides energy to the flowable dielectric material to change the molecular structure of the flowable dielectric material. For example, a remote plasma formed from ammonia may interact with TSA to change the molecular structure of the TSA to form lower molecular weight oligomers (e.g., to break $SiH_3$ bonds of the TSA to form lower molecular weight oligomers). In some embodiments, acts 310 and 312 may be performed in-situ. In some embodiments, acts 310 and 312 may be performed simultaneously, so that the remote plasma is being brought into contact with the flowable dielectric material as it is being spin coated onto the semiconductor substrate.

At act 314, the flowable dielectric material may be cured. Curing the flowable dielectric material hardens the flowable material film to raise the viscosity of the flowable film. In some embodiments, curing the flowable dielectric material comprises exposing the flowable dielectric material to an elevated temperature. In some embodiments, acts 312 and 314 may be performed in separate processing chambers. In other embodiments, acts 312 and 314 may be performed in-situ.

At act 316, the flowable dielectric material is selectively etched to remove the flowable dielectric material from selected areas of the substrate. In some embodiments, the flowable dielectric material is etched one time to form a flowable dielectric material that is relegated to a position that is within gaps between the embedded SiGe region and the first and second gate structures. In some embodiments, the flowable dielectric material is etched one time to a position that forms a planar surface comprising the flowable dielectric material and the embedded SiGe region.

At act 318, a pre-metal dielectric (PMD) layer may be deposited. The PMD layer is deposited above the flowable dielectric material to fill one or more remaining gaps between adjacent gate structures. By depositing a PMD layer onto the flowable dielectric material, gaps between adjacent gate structures are filled using a process (method 300) that uses a single etching procedure.

At act 320, one or more back-end-of-the-line (BEOL) metallization layers are formed above the PMD layer.

FIGS. 4-6 and 9-10 illustrate cross-sectional views of some embodiments of an exemplary semiconductor wafer, whereon method 300 is implemented. Although FIGS. 4-6 and 9-10 are described in relation to a method, it will be appreciated that the structures disclosed in FIGS. 4-6 and 9-10 are not limited to such a method. Rather, it will be appreciated that the illustrated structures of FIGS. 4-6 and 9-10 provide for a structural description of a disclosed semiconductor substrate is able to stand alone independent of a method of formation.

Figure 4:
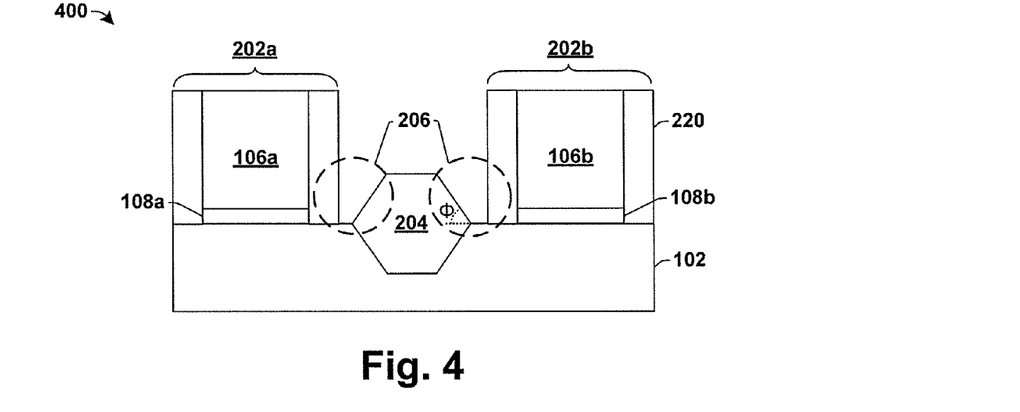
FIGS. 4-5 illustrate cross-sectional views of some embodiments of an exemplary semiconductor substrate, whereon the disclosed method of FIG. 3 is implemented.

FIG. 4 illustrates some embodiments of a cross-sectional view 400 corresponding to act 302.

As shown in cross-sectional view 400, an embedded epitaxial region comprising a silicon-germanium (SiGe) region 204 is formed on a semiconductor substrate 102 (e.g., silicon, germanium, etc.). The embedded SiGe region 204 acts as a shared source/drain of first and second SiGe transistor devices, which are adjacent to one another. In some embodiments, the embedded SiGe region 204 may be formed by performing a wet chemical etch, a dry chemical etch, or a combination thereof, within the semiconductor substrate 102 to produce a recess (with a profile depth of approximately 30 nm-100 nm). The recess is then filled with a strain inducing or high mobility SiGe layer which may be grown epitaxially on the semiconductor substrate 102.

In some embodiments, a first gate structure 202a and a second gate structure 202b are formed on opposite sides of the embedded SiGe region 204. The first and second gate structures, 202a and 202b, are formed by selectively forming a gate oxide layer 108 onto the semiconductor substrate 102. The gate oxide layer 108 may be deposited using a vapor deposition process (e.g., a physical vapor deposition (PVD) process, a chemical vapor deposition (CVD) process, etc.) performed in a processing chamber held under vacuum. A gate region 106 is formed over the gate oxide layer 108. In some embodiments, the gate region 106 comprises polysilicon. Sidewall spacers 220 may be formed on opposite sides of the gate region 106. In various embodiments, the sidewall spacers 220 may be formed by depositing nitride onto the semiconductor substrate 102 and selectively etching the nitride to form the sidewall spacers 220. The resulting SiGe transistor devices comprise an embedded SiGe region 204 that is separated from the gate structures, 202a and 202b, by gaps 206.

Figure 5:
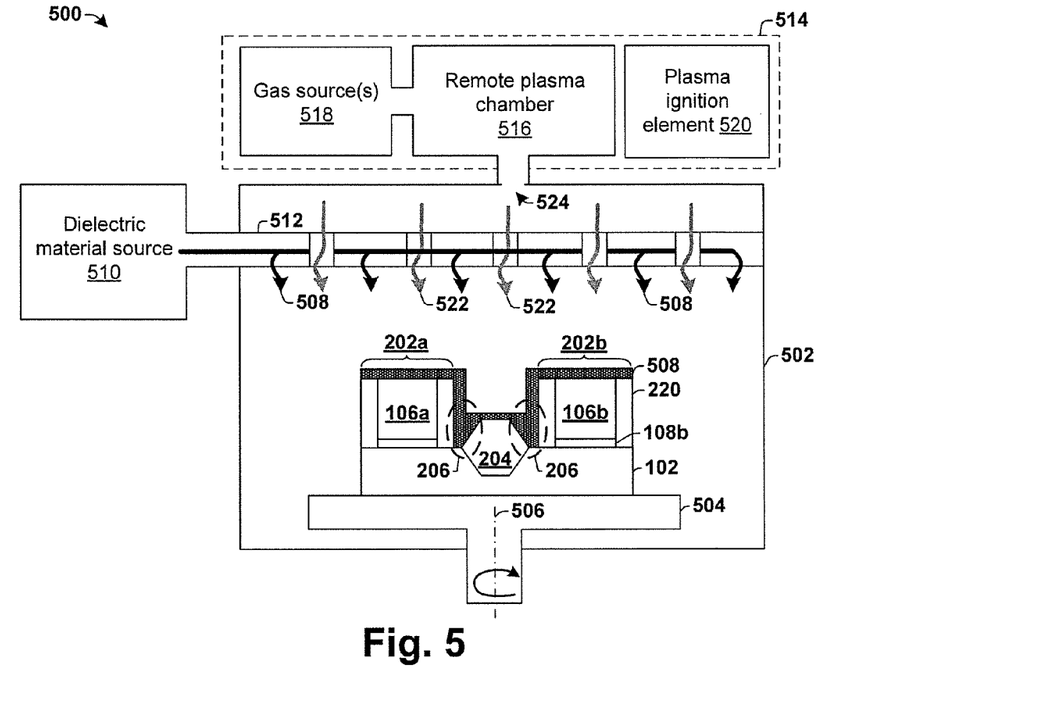

FIG. 5 illustrates some embodiments of a cross-sectional view 500 corresponding to act 310-314. As shown in cross-sectional view 500, the semiconductor substrate 102 is provided into a processing chamber 502 held under vacuum. In some embodiments, the processing chamber 502 is held at a pressure having a range of between approximately 0.7 torr and approximately 1 torr and at a temperature having a range of between approximately 60° C. and approximately 80° C.

In some embodiments, the semiconductor substrate is disposed on a spin chuck 504 configured to rotate about an axis of rotation 506. A liquid flowable dielectric material 508 comprising Trisilylamin (TSA) (i.e., $(SiH_3)_3N$), is provided from a dielectric material source 510 to the semiconductor substrate 102. In some embodiments, the liquid dielectric material 508 may be provided from the dielectric material source 510 to a dual shower head 512. The dual shower head 512 is configured to deposit liquid flowable dielectric material 508 onto the semiconductor substrate 102 in a liquid form by way of a first plurality of openings. As the liquid dielectric material 508 is deposited onto the semiconductor substrate 102, the spin chuck 502 rotates about the axis of rotation 504, causing the liquid flowable dielectric material 508 to be moved outward by centrifugal force, resulting in a uniform film of liquid flowable dielectric material 508 over the semiconductor substrate 102. The uniform film fills the gaps 206 between the SiGe source/drain region 204 and the gate structures, 202a and 202b.

It will be appreciated that the rate of rotation (i.e., the RPM) of the spin chuck 504 during the spin coating process may vary depending upon characteristics of the gaps 206 (e.g., the width of the gaps, the aspect ratio of the gaps, etc). In some embodiments, the spin coating process comprises rotating the semiconductor substrate 102 at a rotation rate of between approximately 8 RPM (rotations per minute) and approximately 12 RPM for approximately 100 to approximately 200 seconds. In some embodiments, the spin coating process may be performed to deposit the liquid flowable dielectric material 508 to a thickness that extends to a position that is between a top surface of the embedded SiGe region 204 and a top surface of the first and second gate structures, 202a and 202b. By minimizing a distance between the top surfaces of the embedded SiGe region 204 and the liquid flowable dielectric material 508, the deposition time (e.g., act 318) and a subsequent etch time (e.g., act 312) may be reduced.

In some embodiments, the processing chamber 502 is further coupled to a plasma source 514 located upstream of the processing chamber 502. The plasma source 514 is configured to generate a remote plasma. In some embodiments, the plasma source 514 may comprise a remote plasma chamber 516 configured to receive one or more gases from a gas source 518. In some embodiments, the one or more gases may comprise ammonia (NHx). In some embodiments, the one or more gases may additionally comprise oxygen.

A plasma ignition element 520 is configured to ignite a remote plasma within the remote plasma chamber 516 by radicalizing molecules of the one or more gases. In some embodiments, the remote plasma may be formed by igniting a mixture of ammonia and oxygen gases. In such embodiments, the ammonia gas may be introduced into the remote plasma chamber 516 at a rate of between approximately 400 and approximately 600 sccm (standard cubic centimeters per minute), while the oxygen may be introduced into the remote plasma chamber 516 at a rate of between approximately 60 and approximately 140 sccm.

In some embodiments, the plasma source 514 may comprise a remote plasma source (RPS). The RPS is configured to generate a remote plasma within the plasma source, but not in the processing chamber 502. Rather, radicals of the remote plasma are introduced into the processing chamber 502, thereby avoiding physical damage to the substrate due to ion bombardment but allowing radicals of the remote plasma to interact with the liquid flowable dielectric material 508.

Radical of the remote plasma 522 are introduced into the processing chamber 502. In some embodiments, radicals of the remote plasma 522 may be introduced into the dual shower head 512 by way of a gas feed through 524. The radicals of the remote plasma 522 are subsequently output from a second plurality of openings in the dual shower head 512 and are brought into contact with the semiconductor substrate 102. The radicals of the remote plasma 522 react with the liquid flowable dielectric material 508. The remote plasma breaks bonds of molecules of the liquid flowable dielectric material 508 (e.g., TSA) to lower the molecular weight oligimer of the molecules of the liquid flowable dielectric material 508. In some embodiments the liquid flowable dielectric material 508 may be spun onto the semiconductor substrate 102 simultaneous with introduction of the remote plasma within the processing chamber 502.

In some embodiments, after the liquid flowable dielectric material 508 has been reacted with radicals of the remote plasma, it is cured to form a cured flowable dielectric material. In some embodiments, the liquid flowable dielectric material 508 may be cured in-situ along with the deposition. In other embodiments, the curing may take place in a separate processing chamber. The liquid flowable dielectric material 508 is cured at a temperature higher than the temperature of the deposition. In some embodiments, The curing steps is performed at a pressure having a range of between approximately 500 torr and approximately 700 torr and at a temperature having a range of between approximately 130° C. and approximately 170° C.

Figure 6:
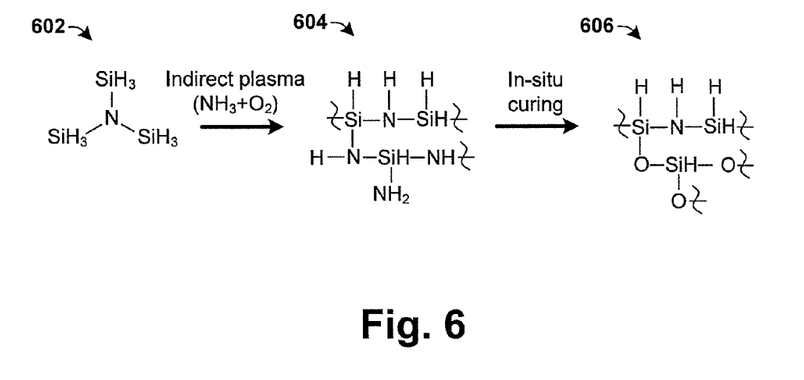
FIG. 6 illustrates figures showing some examples of chemical changes of the molecular structure of Trisilylamin (TSA) during deposition and curing.

FIG. 6 illustrates figures showing some examples of chemical changes of the molecular structure of a flowable dielectric material comprising Trisilylamin (TSA) during deposition and curing. View 602 shows the molecular structure of TSA. TSA comprises three $SiH_3$ molecules bonded to a nitrogen (N) molecule. View 604 shows the molecular structure of TSA after it has been operated upon by an indirect plasma formed from an ammonia ($NH_3$) gas and an oxygen ($O_2$) gas. The indirect plasma causes the molecular structure of the TSA to change as shown in view 604. The indirect plasma provides energy that breaks $SiH_3$ molecules of the TSA to lower the molecular weight oligomers. View 606 shows the molecular structure of TSA after it has been cured by an elevated temperature. Curing the TSA causes the molecular structure of the TSA to change as shown in view 606.

Figure 7A:
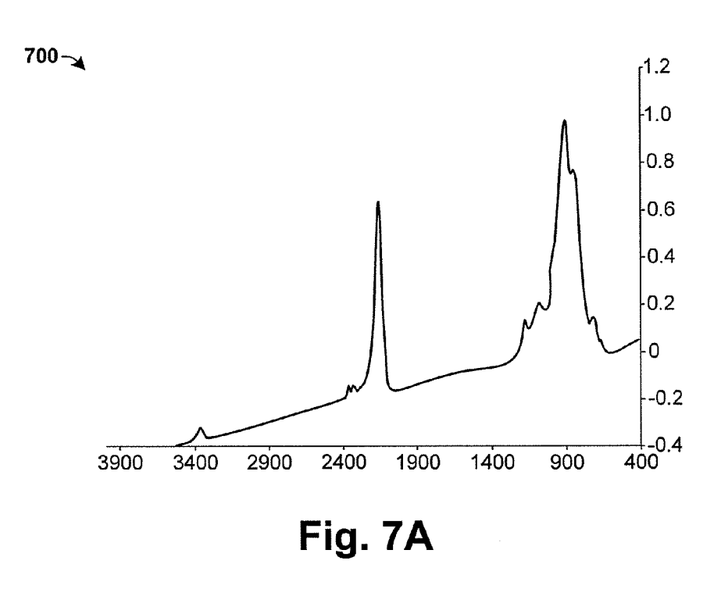
FIGS. 7A-7B illustrates graphs showing some examples of an emission spectrum of TSA during deposition and curing.
Figure 7B:
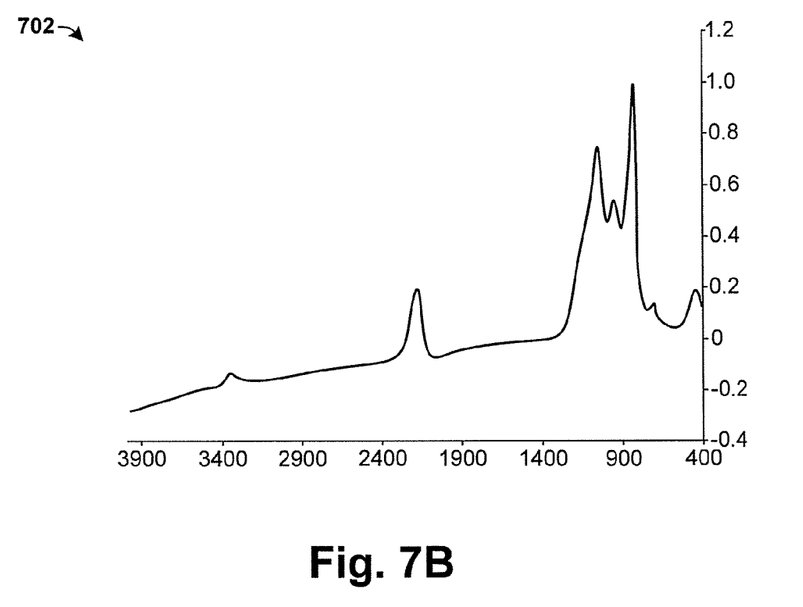

The chemical changes to the TSA vary the emission spectrum of the TSA and therefore can be detected by way of Fourier transform spectroscopy. For example, FIGS. 7A-7B illustrates exemplary graphs, 702 and 704, formed using Fourier transform spectroscopy. The graphs, 702 and 704, show an emission spectrum of TSA at different points in the method 300. FIG. 7A illustrates the spectral density of TSA after deposition (e.g., at act 310). FIG. 7B illustrates the spectral density of the TSA after curing (e.g., at act 314).

The graphs, 702 and 704, show a relative intensity of an emission spectrum on the y-axis and 1/wavelength on the x-axis. As shown by graphs 702 and 704, interaction with the remote plasma and curing change the emission spectrum. For example, the emission spectrum is increased between a value of 1/wavelength having a range of 1/wavelength between approximately 900 and 1400 and the emission spectrum is decreased between a value of 1/wavelength equal to approximately 2300. Furthermore, the slope of the emission spectrum is reduced so that the emission spectrum falls of at a lower rate as the value of 1/wavelength increases.

Figure 8:
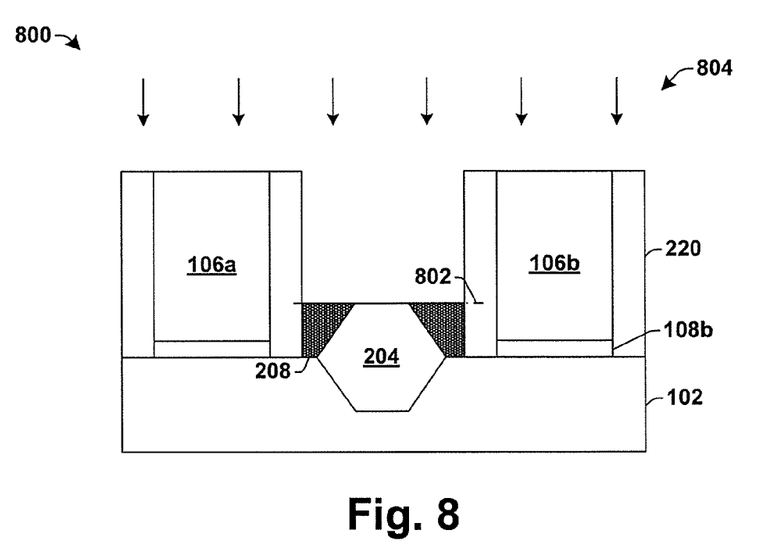
FIGS. 8-10 illustrate cross-sectional views of some embodiments of an exemplary semiconductor substrate, whereon the disclosed method of FIG. 3 is implemented.

FIG. 8 illustrates some embodiments of a cross-sectional view 800 corresponding to act 316. In cross-sectional view 800, the cured flowable dielectric material 802 is etched back to form a flowable dielectric material 208 at a position that forms a planar surface 804 comprising the flowable dielectric material 208 and the embedded SiGe region 204. In some embodiments, the flowable dielectric material 502 is etched back by exposing the cured flowable dielectric material 802 to an etchant 806. The etchant 806 may comprise a wet etchant or a dry etchant. For example, in some embodiments, the etchant 806 may comprise a wet etchant comprising hydroflouric acid (HF), for example.

Figure 9:
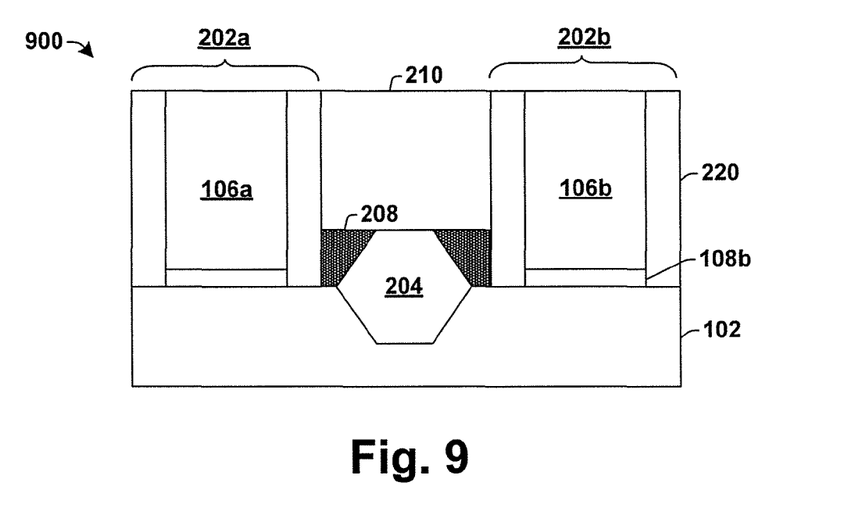

FIG. 9 illustrates some embodiments of a cross-sectional view 900 corresponding to act 318. As shown in cross-sectional view 900, a pre-metal dielectric (PMD) layer 210 is deposited above the flowable dielectric material 208. The PMD layer 210 is formed to fill in remaining areas between the first and second gate structures, 202a and 202b. In various embodiments, the PMD layer 210 may comprise an oxide deposited onto the flowable dielectric material 208 by a chemical vapor deposition (CVD) deposition using high aspect ratio process (i.e., a HARP oxide). For example, in some embodiments, the PMD layer 210 may comprise boron-phosphor-silicate glass deposited by a CVD process.

Figure 10:
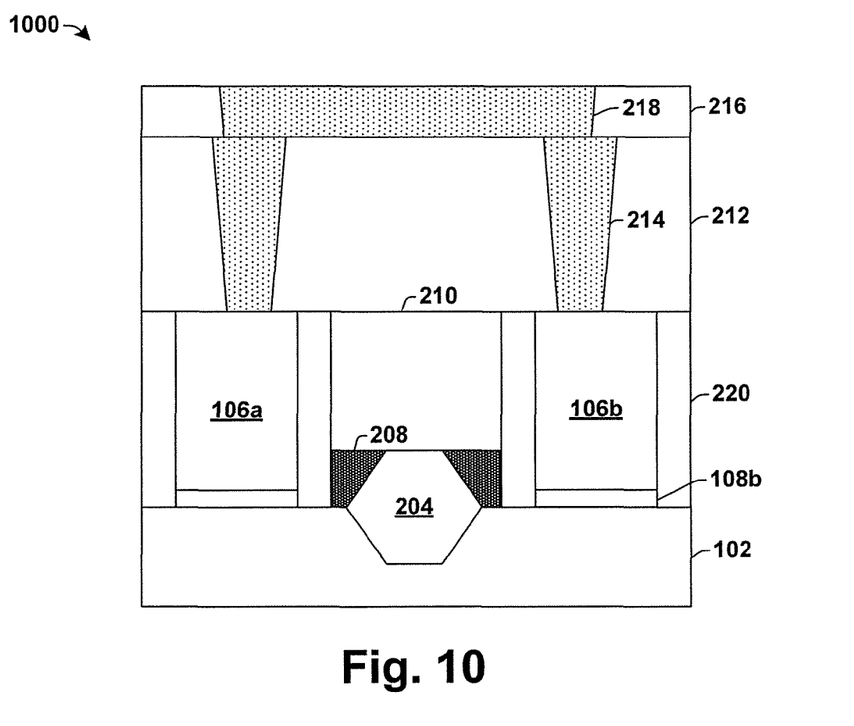

FIG. 10 illustrates some embodiments of a cross-sectional view 1000 corresponding to act 320. As shown in cross-sectional view 800, a first inter-level dielectric (ILD) layer 212 is deposited over the PMD layer 210. In some embodiments, the first ILD layer 212 may comprise a low-k or an ULK layer deposited by way of vapor deposition. One or more metal contacts 214 are formed within the first ILD layer 212. In some embodiments, the one or more metal contacts 214 may be formed by selectively etching the first ILD layer 212 to form one or more trenches and then depositing a metal (e.g., tungsten) within the trench one or more trenches. A second ILD layer 216 may be subsequently deposited over the first ILD layer 212. A metallization layer 218 is formed within the second ILD layer 216. In some embodiments, the metallization layer 218 may be formed by selectively etching the second ILD layer 216 to form a trench and then depositing a metal (e.g., copper) within the trench.

Although the disclosure has been shown and described with respect to a certain aspect or various aspects, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

Therefore, the present disclosure relates to an integrated chip (IC) having transistors with structures separated by a flowable dielectric material, and a related method of formation. The flowable dielectric material (e.g., TSA) may be deposited onto a substrate as a liquid that provides for good gap fill capability between source/drain regions and an embedded epitaxial gate region of a transistor device. Using the disclosed flowable dielectric material for gap fill between the source/drain and embedded epitaxial gate regions achieves a relatively large process window using a simplified process.

In some embodiments, the present disclosure relates to a method of integrated chip processing. The method comprises forming transistor device within a semiconductor substrate having a source region or a drain region comprising an embedded epitaxial region extending as a positive relief from a location within the semiconductor substrate to a position above the semiconductor substrate and a gate structure separated from the embedded epitaxial region by a gap. The method further comprises depositing a flowable dielectric material within the gap between the gate structure and the embedded epitaxial region. The method further comprises depositing a pre-metal dielectric (PMD) layer onto the flowable dielectric material using a vapor deposition process.

In other embodiments, the present disclosure relates to a method of integrated chip processing. The method comprises providing a semiconductor substrate. The method further comprises forming one or more embedded silicon germanium (SiGe) regions extending as a positive relief from a location within the semiconductor substrate to a position above the semiconductor substrate. The method further comprises forming a gate region separated from the one or more embedded SiGe regions by gaps. The method further comprises performing a spin coating process to deposit a flowable dielectric material comprising Trisilylamin (TSA) within gaps located between the one or more embedded SiGe regions and the gate structure. The method further comprises reacting the flowable dielectric material with a remote plasma comprising am and curing the flowable dielectric material to reduce a viscosity of the flowable dielectric material.

In other embodiments, the present disclosure relates to an integrated chip. The integrated chip comprises a semiconductor substrate and an epitaxial region extending as a positive relief from a location within the semiconductor substrate to a position above the semiconductor substrate. The integrated chip further comprises a first gate structure located at a position that is separated from the embedded epitaxial region by a first gap. The integrated chip further comprises a flowable dielectric material disposed between the gate structure and the embedded epitaxial region a pre-metal dielectric (PMD) layer disposed above the flowable dielectric material.

What is claimed is:

1. A method of integrated chip processing, comprising:
    forming a source region or a drain region comprising an embedded epitaxial region extending as a positive relief from a location within a semiconductor substrate to a position above the semiconductor substrate;
    forming a gate structure comprising a gate electrode and a sidewall spacer separated from the embedded epitaxial region by a gap;
    depositing a flowable dielectric material within the gap between the gate structure and the embedded epitaxial region, wherein the flowable dielectric material is separated from the gate electrode by the sidewall spacer;
    selectively etching the flowable dielectric material to remove the flowable dielectric material from a portion of a sidewall of the gate structure, so that a first part of the sidewall abuts the flowable dielectric material and a second overlying part of the sidewall does not abut the flowable dielectric material;
    depositing a pre-metal dielectric (PMD) layer onto the flowable dielectric material using a vapor deposition process, wherein the PMD layer extends from the sidewall spacer to cover an entirety of the source region or the drain region and the flowable dielectric material, and wherein the PMD layer has an upper surface that is substantially co-planar with an upper surface of the gate electrode;
    forming a first inter-level dielectric (ILD) layer over the PMD layer and the gate electrode; and
    forming a metal contact within the first ILD layer, wherein the metal contact electrically contacts the gate electrode.

2. The method of claim 1, wherein the flowable dielectric material comprises Trisilylamin (TSA).

3. The method of claim 1, further comprising:
    depositing the flowable dielectric material into the gap;
    reacting the flowable dielectric material with a plasma; and
    increasing a temperature of the flowable dielectric material to cure the flowable dielectric material.

4. The method of claim 3, wherein the plasma comprises ammonia ($NH_x$).

5. The method of claim 3, wherein curing the flowable dielectric material comprises:
    increasing the temperature of the flowable dielectric material to a range of between approximately 130° C. and approximately 170° C.

6. The method of claim 3, wherein the gap comprises an aspect ratio that is greater than or equal to 14:1.

7. The method of claim 1, wherein the gate structure is formed by:
    forming a gate oxide layer disposed above the semiconductor substrate;
    forming a gate region separated from the semiconductor substrate by the gate oxide layer; and
    forming the sidewall spacer abutting the gate region.

8. The method of claim 1, wherein a width of an upper portion of the gap is larger than a width of a lower portion of the gap that underlies the upper portion.

9. The method of claim 1, wherein the embedded epitaxial region is shared as a source/drain region between the gate structure and an adjacent gate structure.

10. The method of claim 1, wherein the PMD layer comprises a boron-phosphor-silicate glass.

11. The method of claim 1, wherein the flowable dielectric material has a height that is substantially equal to a height to which the positive relief of the embedded epitaxial region extends above the semiconductor substrate.

12. The method of claim 9,
wherein the PMD layer has an upper surface that is co-planar with an upper surface of the gate electrode; and
wherein the PMD layer is a contiguous structure that is that is in direct contact with an upper surface of the flowable dielectric material, with the gate structure, and with the adjacent gate structure.

13. The method of claim 9, wherein only one sidewall spacer is arranged between the PMD layer and the gate electrode.

14. The method of claim 9, wherein the sidewall spacer comprises a first surface contacting the gate electrode and a second surface contacting the PMD layer and the flowable dielectric material.

15. A method of integrated chip processing, comprising:
providing a semiconductor substrate;
forming an embedded silicon germanium (SiGe) region extending as a positive relief from a location within the semiconductor substrate to a position above the semiconductor substrate;
forming a gate structure that comprises a gate electrode between first and second sidewall spacers and that is separated from the embedded SiGe region by a gap;
depositing a flowable dielectric material comprising Trisilylamin (TSA) within the gap located between the embedded SiGe region and the gate structure, wherein the flowable dielectric material is laterally separated from the gate electrode by the first sidewall spacer;
reacting the flowable dielectric material with a remote plasma comprising ammonia; and
curing the flowable dielectric material to reduce a viscosity of the flowable dielectric material;
wherein the flowable dielectric material has a height that is substantially equal to a height to which the positive relief of the embedded SiGe region extends above the semiconductor substrate, so that the flowable dielectric material is confined to the gap.

16. The method of claim 15, wherein forming the gate structure comprises:
forming a gate oxide layer disposed above the semiconductor substrate;
forming a gate region separated from the semiconductor substrate by the gate oxide layer; and
forming the first and second sidewall spacers abutting the gate region.

17. The method of claim 15, wherein curing the flowable dielectric material comprises:
increasing a temperature of the flowable dielectric material to a range of between approximately 130° C. and approximately 170° C.

18. The method of claim 15, further comprising:
forming a pre-metal dielectric (PMD) layer located vertically over the flowable dielectric material and the embedded SiGe region and laterally abutting the gate structure at a position overlying the flowable dielectric material.

19. A method of integrated chip processing, comprising:
forming an embedded epitaxial source/drain region extending as a positive relief from a location within a semiconductor substrate to a position above the semiconductor substrate;
forming a gate structure over the semiconductor substrate, wherein the gate structure comprises a gate electrode and a sidewall spacer and is laterally separated from the embedded epitaxial source/drain region by a gap;
forming a flowable dielectric material within the gap;
forming a pre-metal dielectric (PMD) layer over the flowable dielectric material and the epitaxial source/drain region, wherein the PMD layer comprises a material that is different than the flowable dielectric material, wherein the material is in direct contact with an upper surface of the flowable dielectric material, and wherein the material continuously extends between a sidewall of the gate structure and a sidewall of a second gate structure and has an upper surface that is substantially aligned with an upper surface of the gate electrode;
forming a first inter-level dielectric (ILD) layer over the PMD layer and the gate structure; and
forming a metal contact within the first ILD layer, wherein the metal contact electrically contacts the gate electrode.

20. The method of claim 19, further comprising:
depositing the flowable dielectric material into the gap;
reacting the flowable dielectric material with a plasma; and
increasing a temperature of the flowable dielectric material to cure the flowable dielectric material; and
etching the flowable dielectric material to remove the flowable dielectric material from a portion of the sidewall of the gate structure without removing the flowable dielectric material from within the gap.

* * * * *